US007741756B2

(12) United States Patent
Sudol

(10) Patent No.: US 7,741,756 B2
(45) Date of Patent: Jun. 22, 2010

(54) ULTRASOUND TRANSDUCER AND METHOD FOR IMPLEMENTING FLIP-CHIP TWO DIMENSIONAL ARRAY TECHNOLOGY TO CURVED ARRAYS

(75) Inventor: Wojtek Sudol, Andover, MA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 814 days.

(21) Appl. No.: 10/596,175

(22) PCT Filed: Dec. 1, 2004

(86) PCT No.: PCT/IB2004/052624

§ 371 (c)(1), (2), (4) Date: Jun. 2, 2006

(87) PCT Pub. No.: WO2005/053863

PCT Pub. Date: Jun. 16, 2005

(65) Prior Publication Data

US 2007/0276238 A1 Nov. 29, 2007

Related U.S. Application Data

(60) Provisional application No. 60/527,014, filed on Dec. 4, 2003.

(51) Int. Cl.
*H01L 41/09* (2006.01)

(52) U.S. Cl. ........................................ 310/334

(58) Field of Classification Search .................. 310/334
See application file for complete search history.

(56) References Cited

U.S. PATENT DOCUMENTS

| | | | | |
|---|---|---|---|---|
| 6,049,958 | A * | 4/2000 | Eberle et al. | 29/25.35 |
| 6,618,916 | B1 * | 9/2003 | Eberle et al. | 29/25.35 |
| 6,762,510 | B2 * | 7/2004 | Fock et al. | 257/787 |
| 6,859,984 | B2 * | 3/2005 | Dinet et al. | 29/25.35 |
| 7,449,821 | B2 * | 11/2008 | Dausch | 310/364 |
| 7,474,966 | B2 * | 1/2009 | Fernald et al. | 702/25 |
| 2002/0087083 | A1 * | 7/2002 | Nix et al. | 600/459 |

* cited by examiner

*Primary Examiner*—Thomas M Dougherty
(74) *Attorney, Agent, or Firm*—Todd Holmbo

(57) ABSTRACT

An ultrasound transducer probe (40) includes a support substrate (54), an integrated circuit (42) and an array of piezoelectric elements (50). The support substrate (54) has a non-linear surface (55). The integrated circuit (42) physically couples to the support substrate (54) overlying the non-linear surface (55), wherein the integrated circuit (42) substantially conforms to a shape of the non-linear surface (55). An array of piezoelectric elements (50) couples to the integrated circuit (42).

19 Claims, 3 Drawing Sheets

ULTRASOUND TRANSDUCER AND METHOD FOR IMPLEMENTING FLIP-CHIP TWO DIMENSIONAL ARRAY TECHNOLOGY TO CURVED ARRAYS

CROSS REFERENCE TO RELATED CASES

Applicant claims the benefit of Provisional Application Ser. No. 60/527,014, filed Dec. 4, 2003.

The present disclosure generally relates to transducer arrays for use in medical ultrasound, and more particularly, to a method and apparatus for implementing flip-chip two-dimensional array technology to curved arrays.

In medical ultrasound, two-dimensional transducer arrays are generally used for transmission and reception of ultrasonic or acoustic waves during ultrasound diagnostic imaging. State of the art two-dimensional arrays generally include a flat array having on the order of about three thousand (3,000) transducer elements. In one type of ultrasound transducer design, all transducer elements of an array are attached and individually electrically connected to a surface of an integrated circuit (IC) via flip-chip technology using conductive bumps. The IC provides electrical control of the elements, such as, for beam forming, signal amplifying, etc.

One example of a typical design of an ultrasound transducer is illustrated in FIG. 1. The ultrasound transducer 10 includes a flat array of acoustic elements 12 that are coupled to a surface of an integrated circuit 14 via flip-chip conductive bumps 16. A flip-chip underfill material 18 is included within a region between the flip-chip conductive bumps 16, the integrated circuit 14 and the flat array of acoustic elements 12. Transducer 10 further includes a transducer base 20 and an interconnection cable 22. Interconnection cable 22 is for interconnecting between the integrated circuit 14 and an external cable (not shown). Integrated circuit 14 is electrically coupled to the interconnection cable 22 via wirebonded wires 24, using techniques known in the art.

FIG. 2 is a plan view of an ultrasound probe 30, with a cut-away cross-sectional view of a portion 32 of the probe containing the conventional ultrasound transducer 10 of FIG. 1. FIG. 3 is an enlarged view of the cut-away cross-sectional view of the portion 32 of the probe containing the conventional ultrasound transducer 10. As discussed above, the conventional acoustic array is flat and thus transducer 10 is flat. A preferred shape of the portion of the probe 30 intended for being placed in contact with a patient, from an ergonomic point of view (i.e., probe contact and patient comfort), is a convex surface.

To change the flat face of an acoustic array to an ergonomic convex shape of the probe, a separate interface part is conventionally used to facilitate the transition. For example, as shown in FIG. 3, an acoustic window or lens 34 is disposed on a top surface of the flat transducer 10. The acoustic lens 34 provides a transition from the flat transducer surface to the ergonomic convex shape of the probe 30. In addition, physical structural members 36 and 38 secure the transducer 10 and acoustic lens 34 within the probe 30. However, the addition of interface parts, such as acoustic lens 34, directly in the acoustic path of the transducer array is very disadvantageous. That is, acoustic losses caused by the acoustic attenuation of the interface material and reverberations from each interface are introduced into the acoustic path. As a result, the phenomenon of both the acoustic losses and reverberations decrease an acoustic performance of the ultrasound transducer probe.

In addition, it is noted that flip-chip two-dimensional transducer arrays have a number of advantages. For example, the advantages include having a shortest possible electrical connection path (small capacitance), a smallest possible number of electrical connections, simplicity, size, cost, etc. However, while flip-chip technology can be applied to a large percentage of transducer applications, it also has a significant limitation. That is, IC fabrication technology is limited to flat parts. As a result, this limits application of the flip-chip technology only to flat transducer arrays. However, there exists: a very large application base for curved transducer arrays and the market segment for curved transducer arrays cannot currently be addressed with the flip-chip technology.

Accordingly, an improved ultrasound transducer and method of making the same for overcoming the problems in the art is desired.

An ultrasound transducer probe includes a support substrate, an integrated circuit and an array of piezoelectric elements. The support substrate has a non-linear surface. The integrated circuit physically couples to the support substrate overlying the non-linear surface, wherein the integrated circuit substantially conforms to a shape of the non-linear surface. An array of piezoelectric elements couples to the integrated circuit.

Figure 1:
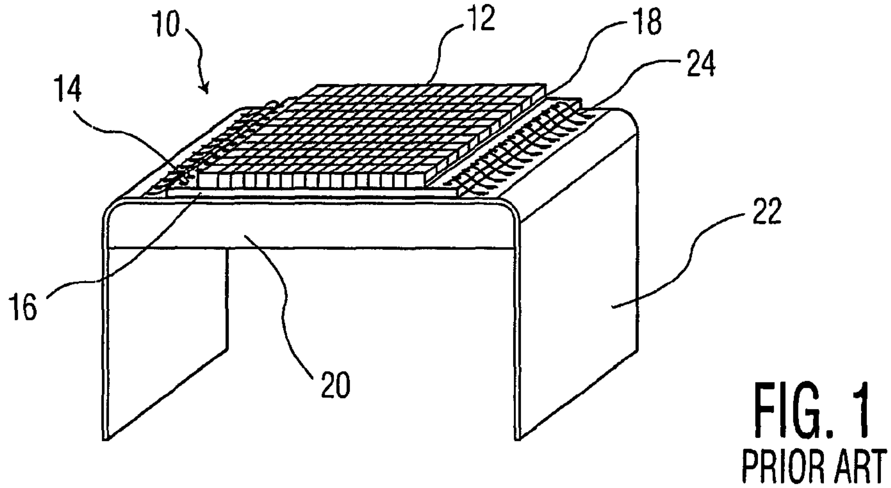
FIG. 1 PRIOR ART
FIG. 1 is a plan view of a conventional ultrasound sensor.
Figure 2:
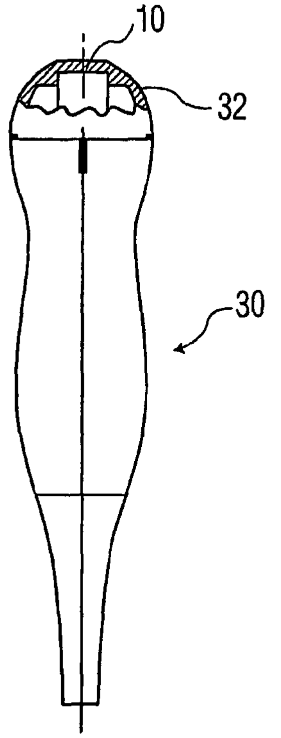
FIG. 2 PRIOR ART
FIG. 2 is a plan view of an ultrasound probe, with a cut-away cross-sectional view of a portion of the probe containing the conventional ultrasound transducer.
Figure 3:
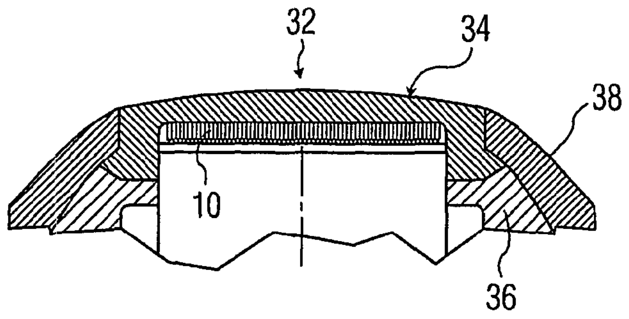
FIG. 3 PRIOR ART
FIG. 3 is an enlarged view of the cut-away cross-sectional view of the portion of the probe containing the conventional ultrasound transducer of FIG. 2.
Figure 4:
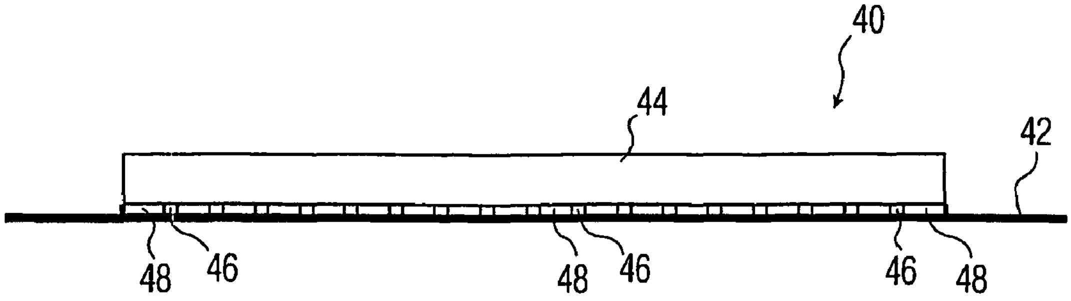
FIGS. 4-6 are cross-sectional views of various steps in the formation of a curved flip-chip two dimensional ultrasound transducer according to an embodiment of the present disclosure.
Figure 5:
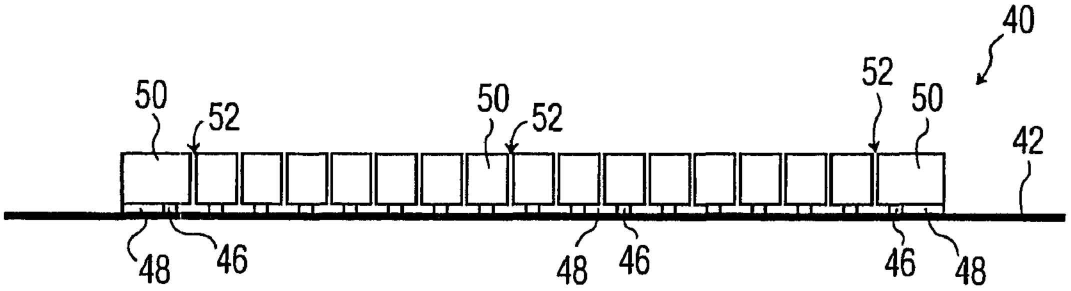
Figure 6:
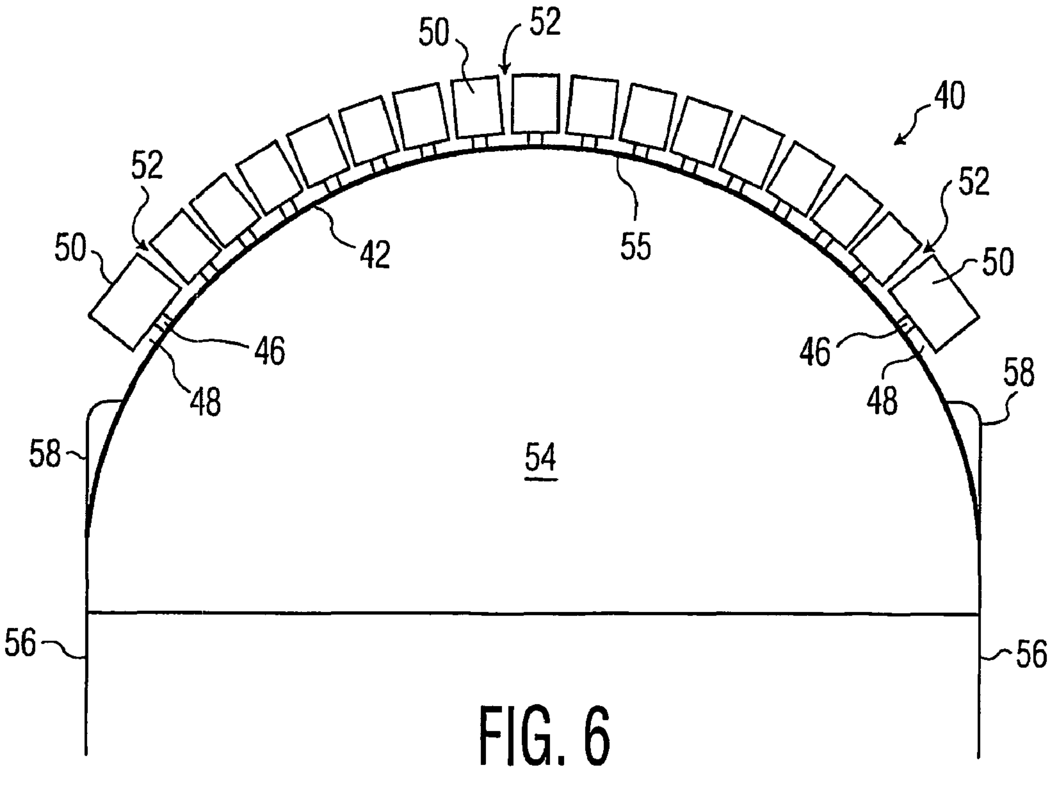

Referring now to FIGS. 4-6, cross-sectional views of various steps in the formation of a curved flip-chip two dimensional ultrasound transducer according to an embodiment of the present disclosure shall be discussed. The embodiments of the present disclosure provide a path to implement flip-chip two-dimensional array technology to curved arrays. In one embodiment, formation of ultrasound transducer 40 begins with coupling integrated circuit (IC) 42 to an acoustic stack of material 44, using flip-chip techniques known in the art. As shown in FIG. 4, the integrated circuit 42 electrically couples to the acoustic stack of material 44 via flip-chip conductive bumps 46. An underfill material 48 is also provided between the integrated circuit 42, the acoustic stack of material 44, and the conductive bumps 46.

Briefly, the flip-chip two-dimensional array of the present disclosure has two sets of electrical connections to the IC. One set of connections is between the IC and the acoustic elements. Another set of connections provides connection of the transducer to the ultrasound system that the transducer is intended to be used with.

The first set of connections can be obtained by one of many different variations of the flip-chip technique. In all instances, one or both sides of a joint are first bumped with either a plated metal bump, screen printed conductive epoxy bumps, bumped by ultrasonic welding of gold wire balls, or bumped with melted and reflowed solder balls. In a second step, both parts are brought together and joined. Again, there are a variety of joining techniques that make the discrete connection of the bump and the IC substrate or bump to bump. In the simplest case there is a direct contact of the tip of the bump with the IC substrate. Often it is advantageous to add a small amount of conductive epoxy between the bump tip and the substrate. Another possibility is implementation of Anisotropic Conductive Adhesive to facilitate the connection between the bump and substrate. Yet another variation is a reflow solder flipchip where the molten solder is implemented to make the bump connection.

In all instances, however there is need for an underfill. The function of the underfill is to actually hold both parts together since the connection of the bumps alone may not be adequate for the strength of the assembly. Also, some of the flip-chip variations require a good hermetic seal of the joint which the underfill can provide. In the case of the flip-chip two-dimensional array, there is one more function that the underfill needs to fulfil. After the flip-chip is completed, a dicing process is done to separate the Acoustic Stack into individual elements. The separating cut needs to deeper than the last layer of the acoustic stack, but not too deep so as to reach the IC. The underfill function is also to support each individual element.

The second set of connections to the IC can be accomplished by wirebonding (as discussed further herein with respect to FIG. 6) or by other means. Examples of possible connection techniques that can be used are: solder process, ultrasonic welding, thermocompression welding, laser welding, conductive elastomer, anisotropic conductive adhesive, flip chip, etc.

Referring again to FIG. 4, integrated circuit 42 can include one or more of a silicon based, a gallium based, or a germanium based integrated circuit. In one embodiment, the integrated circuit 42 has a thickness on the order of approximately 5-50 μm. A benefit of this thickness range is that the integrated circuit becomes flexible.

Subsequent to coupling the integrated circuit and the acoustic stack of material, the acoustic stack of material 44 is diced into individual acoustic elements (FIG. 5) using a dicing process known in the art. For illustration purposes, several of the individual acoustic elements are indicated by reference numeral 50, wherein adjacent individual acoustic elements are separated by a gap 52 resulting from the dicing operation. Dicing of the acoustic stack forms an array of acoustic elements, for example, wherein the acoustic elements include piezoelectric elements. In one embodiment, the array of piezoelectric elements includes a two-dimensional array of transducer elements.

Accordingly, after the dicing operation that separates the slab of acoustic material into individual elements, the assembly (i.e., the IC and the acoustic elements) will be very flexible and can be bent to the desired curvature appropriate for different ultrasound transducer probe applications. For example, one application can include an Abdominal Curved Linear Array (CLA) application, wherein the radius of curvature is selected to correspond with a large size transducer probe. Another application can include, for example, a Trans-Vaginal CLA Array application, wherein the radius of curvature is selected to correspond with a small size transducer probe.

As shown in FIG. 6, ultrasound transducer 40 includes a support substrate 54 having a non-linear surface, an integrated circuit 42 physically coupled to the support substrate 54 overlying the non-linear surface, wherein the integrated circuit substantially conforms to a shape of the non-linear surface, and an array of piezoelectric elements 50 coupled to the integrated circuit 42. During fabrication, the diced structure of the ultrasound transducer 40 is attached to a support substrate 54. The integrated circuit 42 physically attaches to the support substrate using an adhesive, epoxy, or other suitable attachment means.

Support substrate 54 has a non-linear surface 55. Preferably, the non-linear surface 55 includes a smooth curved surface. The smooth curved surface has a radius of curvature selected as a function of a desired ultrasound transducer probe application. For example, the ultrasound transducer probe application can includes a cardiac application, an abdominal application, or a transosophageal (TEE) application.

According to the embodiments of the present disclosure, the thinning of the IC as discussed herein, to have a thickness on the order of 5-50 μm, is also very advantageous from a thermal performance point of view. During the device operation, heat is generated that causes a temperature rise of the device. Heating of the device is not desirable and in most transducer designs, a special heat path must be incorporated therein. Since the silicon material of the IC is in the direct heat path and the silicon material is not a good heat conductor, thinning of the IC provides an additional benefit. To further improve the thermal performance, it is advantageous to select highly thermally conductive material for the supporting structure. In some cases there may a need for an additional attenuation of the array and to improve the acoustic performance it is advantageous to select highly acoustically attenuating material for the supporting structure.

In one embodiment, the support substrate 54 includes a material that is highly thermally conductive. The thermally conductive material preferably has a thermal conductivity in a range on the order of 45 W/mk to 420 W/mk. The thermally conductive material can include brass, aluminum, zinc, graphite or a composite of several materials with a resultant thermal conductivity in the range specified above. In yet another embodiment, the support substrate 54 includes a material that is an acoustic attenuating material, the attenuating material being suitable for attenuating acoustics in a range on the order of 10 dB/cm (at 5 Mhz) to 50 dB/cm (at 5 Mhz). The support substrate material for the acoustic attenuation can include a high durometer rubber or an epoxy composite material that consists of epoxy and a mixture of very high and very low acoustic impedance particles. Still further, the support substrate may include a substrate that is both highly thermally conductive and acoustically attenuating.

Referring still to FIG. 6, ultrasound transducer 40 further includes an interconnection cable 56. Interconnection cable 56 is for interconnecting between the integrated circuit 42 and an external cable (not shown). Integrated circuit 42 electrically couples to the interconnection cable 56 via wirebonded wires 58, using wire bonding techniques known in the art.

Figure 7:
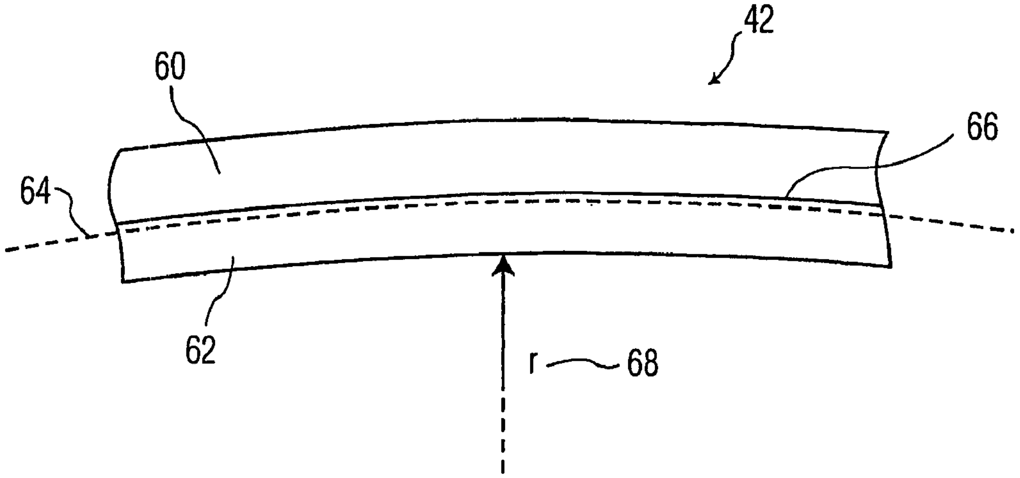
FIG. 7 is a cross-sectional view of a portion of an integrated circuit of the ultrasound transducer in accordance with an embodiment of the present disclosure.

FIG. 7 is a cross-sectional view of a portion of an integrated circuit 42 of the ultrasound transducer 40 in accordance with an embodiment of the present disclosure. Integrated circuit 42 includes a passivation layer 60 and an integrated circuit portion 62 of silicon. The integrated circuit portion 62 includes an active region containing circuit layers. The active region of the integrated circuit includes various circuit layers (not shown) of circuitry for performing at least one of control processing and signal processing functions of the ultrasound transducer probe. Passivation layer 60 includes any suitable dielectric, glass, or insulation layer. Passivation layer 60 overlies the active region of the integrated circuit portion 62. FIG. 7 also illustrates a location of a “no stress region” 64 in the cross sectional view of the portion of the integrated circuit 42. During bending of the integrated circuit, tensile stress is created in the "outside" part of the integrated circuit and there is also a compressive stress in the inside part of the integrated circuit. In addition, there is a location in the cross-sectional view that has "no stress." The location of the "no stress region" 64 is dependent on the dimensions of layers 60 and 62, as well as, on the Modulus of Elasticity of the materials of layers 60 and 62.

A thickness of the passivation layer 60, a thickness of the integrated circuit portion 62, and a Modulus of Elasticity of the passivation layer are selected to assure that the "no stress region" of a bend structure coincide with the active region of the integrated circuit portion 62. The bend structure includes a combined structure of the integrated circuit portion 62 and the passivation layer 60, having a radius of curvature r, as indicated by the reference numeral 68.

The combination of the layer thicknesses and the radius of curvature is selected such that the characteristics of the bend structure include the top layer being stretched, the bottom layer being compressed, and the central region (between the top and bottom layers) being under a neutral stress, wherein the central region corresponds to a region of the neutral fibers of the bend structure. In other words, the thickness of the passivation layer 60 and the thickness of the integrated circuit portion 62 are balanced to provide a location of "neutral fibers" in the region of the active circuit layers of the active region. As a result, the circuitry of the active region experiences substantially no stress during bending of the integrated circuit in the manufacture of the ultrasound transducer probe according to the embodiments of the present disclosure.

Figure 8:
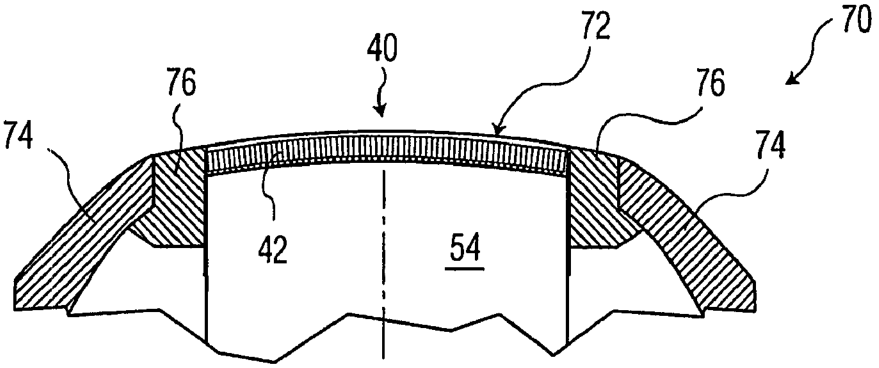
FIG. 8 is a cut-away cross-sectional view of a portion of a probe containing an ultrasound transducer according to an embodiment of the present disclosure.

FIG. 8 is a cut-away cross-sectional view of a portion of a probe 70 containing an ultrasound transducer 40 according to an embodiment of the present disclosure. The ultrasound transducer probe 70 includes a protective layer 72 overlying the array of piezoelectric elements 42 of the transducer 40. The thickness range of the protective layer 72 is on the order of approximately 0.001 to 0.20 inch. The protective layer 72 has a shape substantially conformal to the array of piezoelectric elements 42 and the non-linear surface of the support substrate 54. The shape of the protective layer 72 includes a radius of curvature substantially on the order of a radius of curvature of the array of piezoelectric elements 42 and the non-linear surface of the support substrate 54. In other words, the curved shape of the array is designed for being in contact with a patient via the conformal protective layer without requiring additional material in the acoustic path that changes a shape of the array. In one embodiment, the protective layer 72 includes polyethylene. In addition, physical structural members 74 and 76 secure the transducer 40 and protective layer 72 within the probe 70.

One advantage of the embodiments of the present disclosure is that curving the transducer array enables better ergonomics of the transducer probe to be obtained. A preferred shape of the probe/patient contact portion of the transducer probe, corresponding to the portion intended for being placed in contact with the patient, from an ergonomic point of view is a convex surface. Accordingly, the ergonomics relate to the probe contact and patient comfort. In addition, given that protective layer 72 is substantially conformal to the array of piezoelectric elements 42, acoustic losses caused by the acoustic attenuation of the protective layer and reverberations introduced into the acoustic path are minimal. As a result, the embodiments of the present disclosure provide for an improved acoustic performance of the ultrasound transducer probe.

Figure 9:
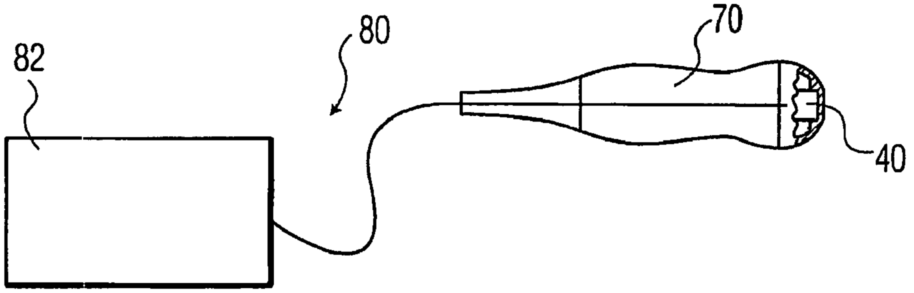
FIG. 9 is a block diagram view of an ultrasound diagnostic imaging system with an ultrasound transducer according to an embodiment of the present disclosure.

FIG. 9 is a block diagram view of an ultrasound diagnostic imaging system 80 with an ultrasound transducer according to an embodiment of the present disclosure. Ultrasound diagnostic imaging system 80 includes a base unit 82 adapted for use with ultrasound transducer probe 70. Ultrasound transducer probe 70 includes ultrasound transducer 40 as discussed herein. Base unit 82 includes additional conventional electronics for performing ultrasound diagnostic imaging. Ultrasound transducer probe 70 couples to base unit 82 via a suitable connection, for example, an electronic cable, a wireless connection, or other suitable means.

According to another embodiment, a method of fabricating an ultrasound transducer probe includes providing a support substrate having a non-linear surface, physically coupling an integrated circuit to the support substrate overlying the non-linear surface, wherein the integrated circuit substantially conforms to a shape of the non-linear surface, and coupling an array of piezoelectric elements to the integrated circuit. In one embodiment, coupling of the array of piezoelectric elements to the integrated circuit includes using flip-chip conductive bump connections.

Further as discussed herein, the integrated circuit includes an active region and a passivation layer overlying the active region, wherein a thickness of the integrated circuit and a thickness of the passivation layer are selected to assure that neutral fibers of a bend structure coincide with the active region of the integrated circuit, wherein the bend structure includes that of the integrated circuit and the passivation layer. In one embodiment, the integrated circuit has a thickness on the order of approximately 5-50 μm.

The method can further include providing an overlying protective layer with respect to the array of piezoelectric elements, the protective layer having a shape substantially conformal to the array of piezoelectric elements and the non-linear surface of the support substrate. The shape of the protective layer preferably includes a radius of curvature substantially on the order of a radius of curvature of the array of piezoelectric elements and the non-linear surface of the support substrate. In one embodiment, the protective layer is polyethylene.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The invention claimed is:

1. An ultrasound transducer probe, comprising:

a support substrate having a convex shaped non-linear surface;

an integrated circuit physically coupled to the support substrate overlying the convex shaped non-linear surface, wherein said integrated circuit substantially conforms to a convex shape of the convex shaped non-linear surface; and an array of piezoelectric elements coupled to said integrated circuit.

2. The ultrasound transducer probe of claim 1, wherein said integrated circuit is physically attached to the support substrate via at least one of an adhesive and an epoxy.

3. The ultrasound transducer probe of claim 1, wherein the non-linear surface of said support substrate includes a smooth curved surface.

4. The ultrasound transducer probe of claim 3, further wherein the smooth curved surface has a radius of curvature selected as a function of a desired ultrasound transducer probe application, wherein the desired ultrasound transducer probe application includes one selected from the group consisting of a cardiac application, an abdominal application, and a transosophageal application.

5. The ultrasound transducer probe of claim 1, wherein said integrated circuit has a thickness on the order of approximately 5-50 μm.

6. The ultrasound transducer probe of claim 1, wherein said integrated circuit includes an active region, said ultrasound transducer probe further comprising:

a passivation layer overlying the active region of said integrated circuit, wherein a thickness of said integrated circuit and a thickness of said passivation layer are selected to assure that neutral fibers of a bend structure coincide with the active region of said integrated circuit, wherein the bend structure includes that of said integrated circuit and said passivation layer.

7. The ultrasound transducer probe of claim 6, wherein the active region of said integrated circuit includes circuitry for performing at least one of control processing and signal processing functions of said ultrasound transducer probe.

8. The ultrasound transducer probe of claim 1, wherein said integrated circuit includes at least one of a silicon based, a gallium based, and a germanium based integrated circuit.

9. The ultrasound transducer probe of claim 1, wherein said array of piezoelectric elements includes a two-dimensional array of piezoelectric transducer elements.

10. The ultrasound transducer probe of claim 1, wherein said array of piezoelectric elements is coupled to said integrated circuit via flip-chip conductive bump connections.

11. The ultrasound transducer probe of claim 1, wherein said support substrate includes a highly thermally conductive material, the conductive material having a thermal conductivity in a range on the order of 45 W/mk to 420 W/mk.

12. The ultrasound transducer probe of claim 1, wherein said support substrate includes a highly acoustic attenuating material, the attenuating material for attenuating acoustics in a range on the order of 10 dB/cm at 5 MHz to 50 dB/cm at 5 MHz.

13. The ultrasound transducer probe of claim 1, further comprising:

a protective layer overlying the array of piezoelectric elements, said protective layer having a shape substantially conformal to said array of piezoelectric elements and the non-linear surface of said support substrate.

14. The ultrasound transducer probe of claim 13, wherein the shape of said protective layer includes a radius of curvature substantially on the order of a radius of curvature of said array of piezoelectric elements and the non-linear surface of said support substrate.

15. The ultrasound transducer probe of claim 13, wherein said protective layer includes polyethylene.

16. An ultrasound transducer probe, comprising:

a support substrate having a convex shaped non-linear surface;

an integrated circuit physically coupled to said support substrate overlying the convex shaped non-linear surface, wherein said integrated circuit substantially conforms to a convex shape of the convex shaped non-linear surface, and wherein said integrated circuit includes an active region and a passivation layer overlying the active region, wherein a thickness of said integrated circuit and a thickness of the passivation layer are selected to assure that neutral fibers of a bend structure coincide with the active region of said integrated circuit, wherein the bend structure includes that of said integrated circuit and the passivation layer; and an array of piezoelectric elements coupled to said integrated circuit via flip-chip conductive bump connections.

17. The ultrasound transducer probe of claim 16, wherein the non-linear surface of said support substrate includes a smooth curved surface having a radius of curvature selected as a function of a desired ultrasound transducer probe application, wherein the desired ultrasound transducer probe application includes one selected from the group consisting of a cardiac application, an abdominal application, and a transosophageal application.

18. The ultrasound transducer probe of claim 17, wherein said integrated circuit has a thickness on the order of approximately 5-50 μm.

19. The ultrasound transducer probe of claim 16, further comprising:

a protective layer overlying said array of piezoelectric elements, said protective layer having a shape substantially conformal to said array of piezoelectric elements and the non-linear surface of said support substrate.

* * * * *